(12) United States Patent
Sills et al.

(10) Patent No.: US 10,333,064 B2
(45) Date of Patent: Jun. 25, 2019

(54) VERTICAL MEMORY CELL FOR HIGH-DENSITY MEMORY

(75) Inventors: Scott E. Sills, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 671 days.

(21) Appl. No.: 13/086,321

(22) Filed: Apr. 13, 2011

(65) Prior Publication Data
US 2012/0261638 A1   Oct. 18, 2012

(51) Int. Cl.
*H01L 47/00*   (2006.01)
*H01L 45/00*   (2006.01)
*H01L 27/24*   (2006.01)

(52) U.S. Cl.
CPC ........ *H01L 45/1226* (2013.01); *H01L 27/249* (2013.01); *H01L 27/2463* (2013.01); *H01L 45/06* (2013.01); *H01L 45/08* (2013.01); *H01L 45/085* (2013.01); *H01L 45/122* (2013.01); *H01L 45/142* (2013.01); *H01L 45/143* (2013.01); *H01L 45/144* (2013.01); *H01L 45/146* (2013.01); *H01L 45/147* (2013.01)

(58) Field of Classification Search
CPC ............. H01L 45/1226; H01L 27/2463; H01L 27/249; H01L 45/06; H01L 45/08; H01L 45/085; H01L 45/122; H01L 45/142
USPC .......................................................... 257/1–5
See application file for complete search history.

(56) References Cited

U.S. PATENT DOCUMENTS

| 7,027,322 | B2* | 4/2006 | Suzuki et al. ................ 365/158 |
| 7,527,985 | B2* | 5/2009 | Lai et al. ......................... 438/3 |
| 7,535,746 | B2* | 5/2009 | Kawazoe ........... G11C 13/0007 365/148 |
| 7,883,929 | B2 | 2/2011 | Choi et al. |
| 8,124,968 | B2* | 2/2012 | Koo ...................... H01L 27/101 257/4 |
| 8,299,571 | B2* | 10/2012 | Ozawa et al. ................ 257/530 |
| 2005/0040482 | A1 | 2/2005 | Suzuki et al. |
| 2005/0243630 | A1* | 11/2005 | Hsu et al. ...................... 365/222 |
| 2006/0099724 | A1* | 5/2006 | Hsu et al. ........................ 438/3 |

(Continued)

OTHER PUBLICATIONS

Jinsik Choi, et al.; Different Nonvolatile Memory Effects in Epitaxial Pt/PbZr0.3Ti0.7O3/LSCO Heterostructures; Applied Physics Letter 96, 262113 (2010).

(Continued)

*Primary Examiner* — Ori Nadav
(74) *Attorney, Agent, or Firm* — Fletcher Yoder, P.C.

(57) ABSTRACT

This disclosure provides embodiments for the formation of vertical memory cell structures that may be implemented in RRAM devices. In one embodiment, memory cell area may be increased by varying word line height and/or word line interface surface characteristics to ensure the creation of a grain boundary that is suitable for formation of conductive pathways through an active layer of an RRAM memory cell. This may maintain continuum behavior while reducing random cell-to-cell variability that is often encountered at nanoscopic scales. In another embodiment, such vertical memory cell structures may be formed in multiple-tiers to define a three-dimensional RRAM memory array. Further embodiments also provide a spacer pitch-doubled RRAM memory array that integrates vertical memory cell structures.

20 Claims, 13 Drawing Sheets

(56) References Cited

U.S. PATENT DOCUMENTS

| | | | |
|---|---|---|---|
| 2006/0105556 A1 | 5/2006 | Matsui et al. | |
| 2008/0203377 A1* | 8/2008 | Choi et al. | 257/5 |
| 2008/0304308 A1* | 12/2008 | Stipe | 365/51 |
| 2009/0251963 A1* | 10/2009 | Seol et al. | 365/185.05 |
| 2010/0080037 A1* | 4/2010 | Inoue | G11C 13/0007 365/148 |
| 2010/0163823 A1* | 7/2010 | Sim et al. | 257/2 |
| 2011/0115049 A1* | 5/2011 | Kim | H01L 45/04 257/530 |
| 2011/0199825 A1* | 8/2011 | Han et al. | 365/185.11 |
| 2011/0205796 A1* | 8/2011 | Kim | 365/185.09 |
| 2012/0147650 A1* | 6/2012 | Samachisa et al. | 365/51 |
| 2013/0009122 A1* | 1/2013 | Park et al. | 257/2 |
| 2013/0037774 A1* | 2/2013 | Song et al. | 257/2 |

OTHER PUBLICATIONS

Ramanathaswamy Pandian, et al.; Polarity-Dependent Reversible Resistance Switching in Ge—Sb—Te Phase-Change Thin Films; Applied Physics Letter 91, 152103 (2007).

Myoung-Jae Lee, et al.; Electrical Manipulation of Nanofilaments in Transition-Metal Oxides for Resistance-Based Memory; ACS Publications; Apr. 10, 2009.

Taiwan Office Action dated Mar. 25, 2014.

Wen-Yuan Chang, et al.; Unipolar resistive switching characteristics of ZnO thin films for novolatile memory applications; Applied Physics Letters 92. 022110 (2008).

Sung-Oong Kang, et al.; Layer-to-island growth of electrodeposited $Cu_2O$ films and filamentary switching in single-channeled grain boundaries; Journal of Applied Physics 107. 053704 (2010).

* cited by examiner

"OFF STATE"

"ON STATE"

VERTICAL MEMORY CELL FOR HIGH-DENSITY MEMORY

BACKGROUND

1. Field of the Invention

Embodiments of the present invention relate generally to the field of memory devices and, more particularly, to resistive random access memory (RRAM) devices.

2. Description of the Related Art

Electronic devices, such as computer systems, are often employed in numerous configurations to provide a variety of computing functions. For instance, computing speeds, system flexibility, applications, and form factor are typically some of the characteristics considered by design engineers tasked with the development of computing systems and their respective components. Often, such computing systems may include one or more memory devices which may be used to store applications (including program files and data) which may be accessible by other system components, such as one or more processors (e.g., CPU) or peripheral devices. By way of example, such memory devices may include volatile memory devices, such as dynamic random access memory (DRAM), or non-volatile memory devices, or a combination of both.

Non-volatile memory devices may include read-only memory (ROM), magnetic storage, flash memory, resistive random access memory (RRAM), and so forth. In particular, RRAM has become increasing popular due at least in part to its faster write/erase cycles (on the order of nanoseconds (ns)) and lower power consumption relative to conventional DRAM and flash memories, as well as its potential for use in high density memory devices, such as memory devices having memory cells fabricated at nanoscopic dimensions. RRAM is a general classification that may include memory devices based on: (1) oxygen vacancy switching materials, such as binary transition metal oxides (TMO), mixed valence oxides (MVO), and/or complex/conductive metal oxides (CMO) (e.g., providing for filamentary or area-distributed (interfacial) conductive pathways), (2) conductive-bridging RAM (CBRAM) and/or programmable metallization cell (PMC), and (3) phase change memory (PCRAM or PCM). RRAM devices may include an array of memory cells, wherein each memory cell includes first and second electrodes separated by an active material, which may have variable resistive properties and be capable of being switched between different states of electrical resistivity. For instance, the active material, which may include transition-metal oxides and/or chalcogenides, may transition between a high resistive state (an "OFF" state) and a low resistive state (an "ON" state) based upon an applied voltage. In some cases, when the active material transitions to the ON state in response to the applied voltage, conductive pathways, which may resemble a filament or may be area-distributed (e.g., interfacial), may be formed within the active material, thus providing a conductive path (e.g., a short circuit) between the electrodes of the RRAM memory cell. Removing the applied voltage or applying a different voltage (depending on the type of active material being used), may cause the conductive path to break or dispel, thus disconnecting the RRAM memory cell and returning it to the OFF state.

Further, as the development of non-volatile memory technologies, including RRAM, continues to trend towards smaller scaling dimensions (e.g., nanoscales), bulk deviating material and transport properties are often encountered. This may result in increasing cell-to-cell random variability due, for example, to continuum behavior breakdown and quantum effects that may become more apparent at such low dimensions. Accordingly, control of the formation of conductive current pathways through variable resistance materials is often recognized as one of several challenging aspects in the design of resistive memory devices and, particularly, resistive memory devices at nanoscopic dimensions.

Embodiments of the present invention may be directed to one or more of the problems described above.

DETAILED DESCRIPTION

As discussed in further detail below, embodiments of the present invention relate to techniques for designing, manufacturing, and fabricating RRAM memory devices. In particular, certain embodiments provide vertical memory cell structures that may be implemented in RRAM devices. In one embodiment, cell area may be increased by word line height and/or interface surface characteristics to ensure the creation of a grain boundary that is suitable for formation of a preferential current path through an active layer of an RRAM memory cell. This may maintain continuum behavior while reducing random cell-to-cell variability that is often encountered at nanoscopic scales. By way of example, techniques relating to the formation of grain boundaries are disclosed in U.S. Pat. No. 7,883,929 (application Ser. No. 12/035,169), which is hereby incorporated by reference in its entirety. In another embodiment, the vertical memory cell structures may be formed in multiple-tiers to define a three-dimensional RRAM memory array. Further embodiments also provide a spacer-based RRAM memory array that integrates vertical memory cell structures. These and other features, aspects, and advantages will be discussed in further detail with regard to the following description of various embodiments of the present invention.

Figure 1:
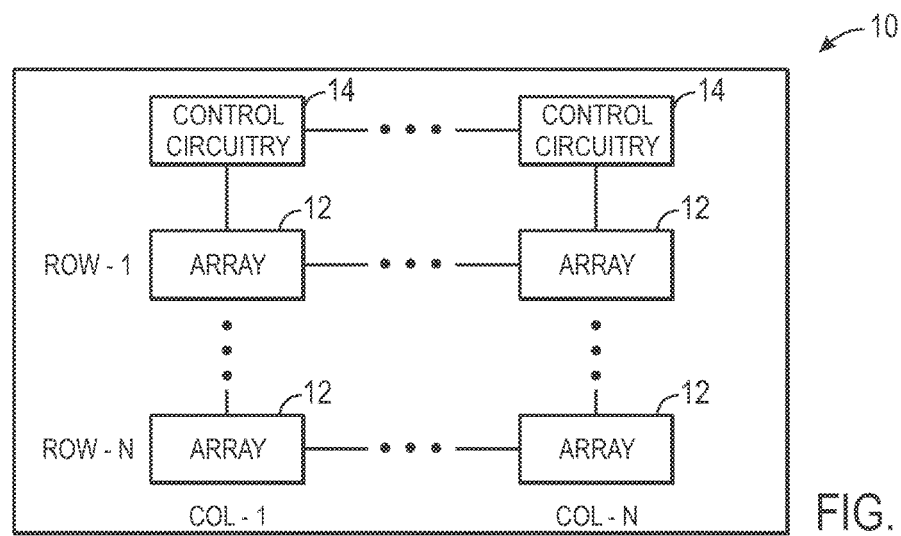
FIG. 1 is a simplified block diagram of a memory chip that may be used in accordance with embodiments of the present invention.

With the foregoing points in mind, FIG. 1 illustrates a simplified block diagram of a memory chip 10. As shown in FIG. 1, the memory device 10 may include a number of memory arrays 12 arranged in rows (e.g., Row-1, . . . , Row-N) and columns (e.g., Col-1, . . . , Col-N). As can be appreciated, the use of the terms "rows" and "columns" is not intended to imply or specify a particular horizontal or vertical orientations of the memory arrays 12. Rather, the depiction of rows and columns is meant to convey that a number of arrays may be logically connected regardless of their physical orientation. For instance, in some embodiments, the rows and columns of memory arrays 12 may be logically connected in staggered (e.g., non-linear) orientation. In further embodiments, as discussed further below, one or more of the memory arrays 12 may include RRAM memory cells configured as a three-dimensional "tiered" array utilizing cross-point memory architectures.

Each of the memory arrays 12 in a column may be coupled to respective control circuitry 14. Though not depicted in the simplified representation of FIG. 1, each control circuitry 14 may include sense amplifiers that may be used to sense reference levels associated with memory cells. Also, as further described herein, control circuitry 14 may include a write driver used to program memory cells. In accordance with embodiments of the present disclosure, the memory device 10 may be one of a number of memory chips that are part of a resistive random access memory (RRAM) device.

Figure 2:
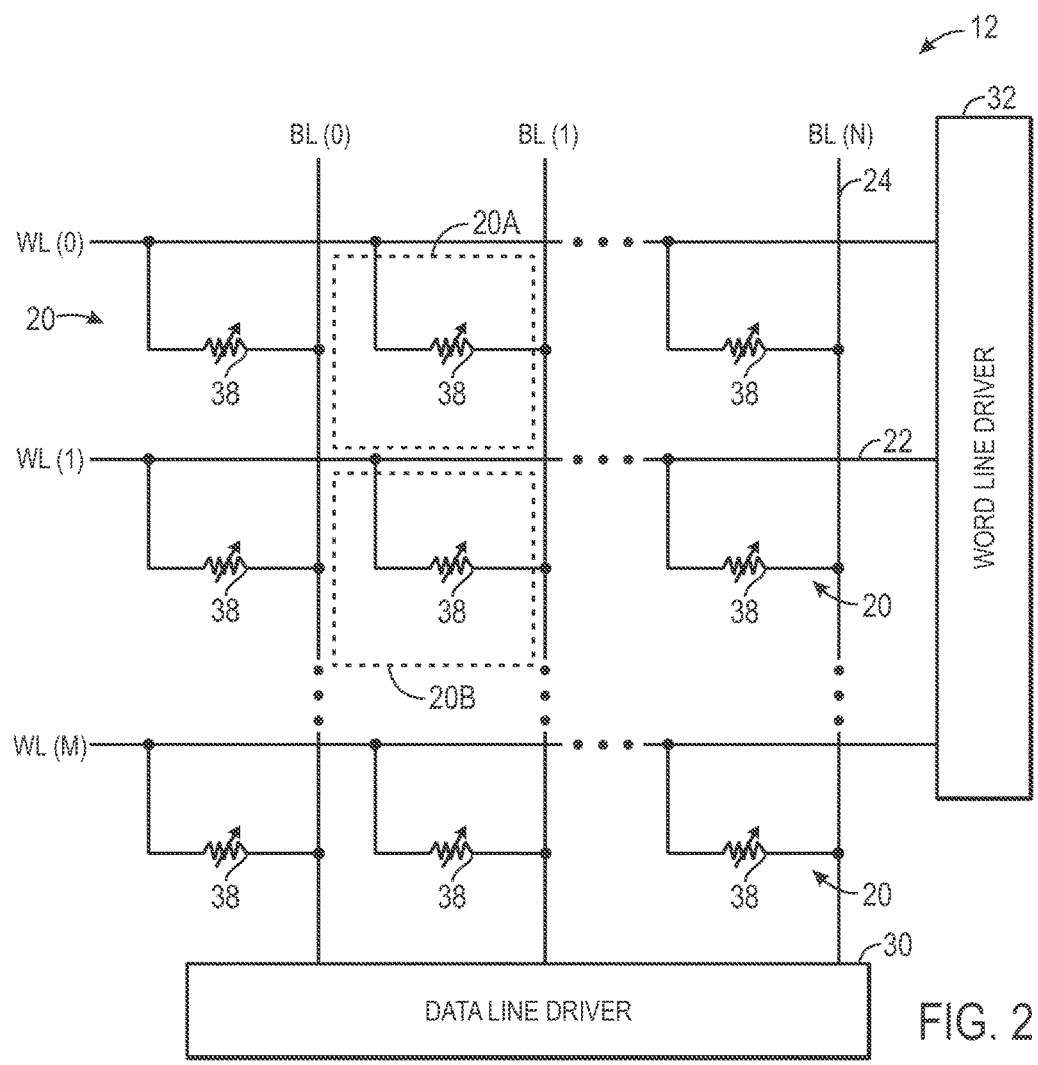
FIG. 2 is a schematic diagram showing a portion of a memory array of non-volatile memory cells that may include resistive memory cells constructed in accordance with embodiments of the present invention.

FIG. 2 is a two-dimensional schematic diagram illustrating of a portion of one of the memory arrays 12 shown in FIG. 1. In the illustrated embodiment, the memory array 12 may utilize a two-terminal cross-point configuration. In further embodiments, the memory array 12 may also include metal-oxide-semiconductor field-effect-transistor (MOSFET)-based memory arrays, diode-based memory arrays, bipolar-junction transistor (BJT)-based memory arrays, as well as any other types of memory arrays, as will be understood by one of ordinary skill in the art. In some embodiments, the memory array 12 may include additional film layers, such as metal insulating metal (MIM) layers. In such embodiments, the above-mentioned diodes and/or transistors may be formed in these additional layers.

The array 12 may include memory cells 20 constructed in accordance with embodiments of the present invention, as well as a set of word lines WL(0)-WL(N), referred by reference number 22, and intersecting bit lines BL(0)-BL(M), referred to by reference number 24. With regard to terminology commonly used in the context of memory devices, the word lines 22 may sometimes also be referred to as select lines or access lines, and the bit lines 24 may sometimes also be referred to as sense lines or data lines. The memory cells 20 are generally located at the intersection of each word line 22 and data line 24. By way of example, the memory cell 20a is shown as being coupled to bit line BL(1) and word line WL(0), and the memory cell 20b is shown as being coupled to bit line BL(1) and word line WL(1).

In this symbolic representation, each memory cell 20 a variable resistive element 28 coupled to a bit line 24 and word line 22. The resistive elements 28 of the memory cells 20 may be formed in accordance with the techniques and embodiments discussed below. As shown in FIG. 2, the bit lines 24 may be connected to data line driving circuitry 30, which may include one or more data line drivers and/or sense amplifiers. As will be appreciated, memory cells 20 coupled to a common word line (e.g., WL(0)) may be referred to as a "row" of the memory array 12. Further, the word lines 24 may each be coupled to word line driving circuitry 32. Thus, during operation, a row of memory cells 20 may be activated by activating its respective word line using the word line driving circuitry 32. Once activated, data stored in the memory cells 20 of the activated row may be read out via the bit lines 24. As discussed further below, the cells 20 of the memory array 12 may be configured as vertical memory cells utilizing single-tier or multiple-tier cross-point memory architectures, in which the word lines and bit lines may intersect in a perpendicular "cross-point" arrangement. When multiple-tier configurations are utilized, such vertical memory cells may collectively form a three-dimensional memory array.

With regard to the memory cells 20, the resistive element 28 may include an active layer disposed between first and second electrodes. In accordance with certain embodiments, the active material or layer may include a material with variable resistive properties, such as transition-metal oxides or chalcogenides having a polycrystalline structure. By way of example only, the active layer may include nickel-oxide (NiO), silver-indium-antimony-tellurium (AgInSbTe), or a GST ($Ge_2Sb_2Te_5$) thin film. In some embodiments, the electrodes may include Ag, Cu, Ni, Zn, Pt, or any other suitable metal. The active layer may include a solid electrolyte, such as a chalcogenide glass having a formula AxBy, where B is selected from among S, Se and Te and mixtures thereof, and where A includes at least one element from Group iii-A(B, Al, Ga, In, Tl), group IV-A (C, Si, Ge, Sn, Pb), Group V-A (N, P, As, Sb, Bi), or group VII-A (F, Cl, Br, I, At) of the periodic table and with the dopant that may be selected from among the noble metals and transition metals including Ag, Au, Pt, Cu, Cd, Ir, Ru, Co, Cr, Mn or Ni. For example, such solid electrolytes may include $As_xS_{1-x}$—Ag, $Ge_xSe_{1-x}$—Ag, $Ge_xS_{1-x}$—Ag, $As_xS_{1-x}$—Cu, $Ge_xSe_{1-x}$—Cu, $Ge_xS_{1-x}$—Cu, $Ge_xTe_{1-x}$—Cu, $Sn_xSe$, wherein x=0.1 to 0.5, or other doped chalcogenide glasses with Ag, Cu, Zn or with modifiers of halogens, halides or hydrogen (note: x=0.1 to 0.5). In other embodiments, the solid electrolyte may also include undoped or doped oxides with such as $MoO_x$, $TaO_x$, $ZrO_x$, $HfO_x$, $TiO_x$, $MgO_x$, $NbO_x$, $AlO_x$, $GdO_x$, $NiO_x$ $GeO_2$, $As_2O_3$, $Ag_2O$, $Cu_{(1,2)}O$, $WO_x$ or other suitable transition metal oxides. In other embodiments, the active layer may include any suitable rare earth metal oxide, $SiO_x$, amorphous or crystalline Si, $Zn_xCd_{(1-x)}S$, amorphous C, CuC, or $Cu_2S$.

Additionally, the active layer may include a mixed valence oxide (MVO) (sometimes also referred to as complex metal oxides or conductive metal oxides). For instance, the active layer may include a complex metal oxide having a Perovskite structure, which may be expressed as $^{XII}A^{2+}vi B^{4+}X^{2-}_3$ with oxygen in the face centers of the crystal structure, or more generally expressed as $ABX_3$, where A and B represent cations of different sizes, and X represents an anion that bonds to both A and B. By way of example only, X may be oxygen or another compound anion, such as $MnO_4^{2-}$. An example of a complex metal oxide having a Perovskite structure may be PCMO (PrCaMnO, or more specifically expressed as $Pr_{0.7}Ca_{0.3}MnO_3$). Other examples of materials having Perovskite structures may include $Ba_{0.6}Sr_{0.4}TiO_3$ (BaSrTiO$_3$), $SrZrO_3$, $La_{1-x}Ca_xMnO_3$ (LCMO), $LaSrMnO_3$ (LSMO), $GdBaCo_2O_{5+x}$ (GBCO), $PbZr_{0.3}Ti_{0.7}O_3$ (PZTO), and $La_{0.5}Sr_{0.5}CoO_3$ (LSCO).

As discussed above, the active layer of the RRAM memory cells 20 may implement reversible resistive switching via transitioning between a high resistive state (an OFF state) and a low resistive (an ON state) in response to an applied voltage. For instance, the active layer may be normally insulating (exhibiting the high resistive state). When an activating voltage is applied, the memory cell 20 transitions to an ON state, and a conductive path between the electrodes is formed within the active layer. When a deactivating voltage is applied (which, in some embodiments, may be a voltage having the same magnitude but opposite polarity with respect to the activating voltage), the conductive path is dispelled or ruptured, thus returning the active layer into an insulating state (the OFF state). Thus, the conductive paths are "reversible" in the sense that they may be formed, broken, and then re-formed depending on an applied voltage.

In certain embodiments, when the memory cell 20 is in the ON state (e.g., the resistive element 28 exhibits low resistance), charge transport through the active layer may be envisioned as a filament-like conductive path that forms within the active layer due to electro-migration of metal ions through the active layer. In other embodiments, an area-distributed conductive path may be formed due to the drift of oxygen anions or vacancies in the active layer material (e.g., a mixed valence oxide). It should be appreciated that while certain examples discussed below may refer specifically to filament-shaped paths or area-distributed paths, the techniques described herein are generally applicable to both. Accordingly, it should be understood that the term conductive path, conductive pathway, or the like, as used herein, may refer to both filamentary pathways (e.g., resulting from electro-migration of metal ions through an active layer) or area-distributed conductive pathways (e.g., resulting from drift of oxygen anions/vacancies in the active layer).

Figure 3A:
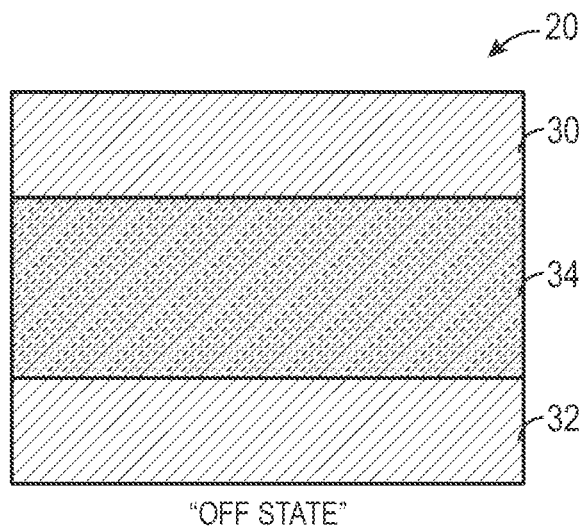
FIGS. 3A and 3B are simplified cross-sectional views of a resistive random access memory cell in accordance with embodiments of the present invention.
Figure 3B:
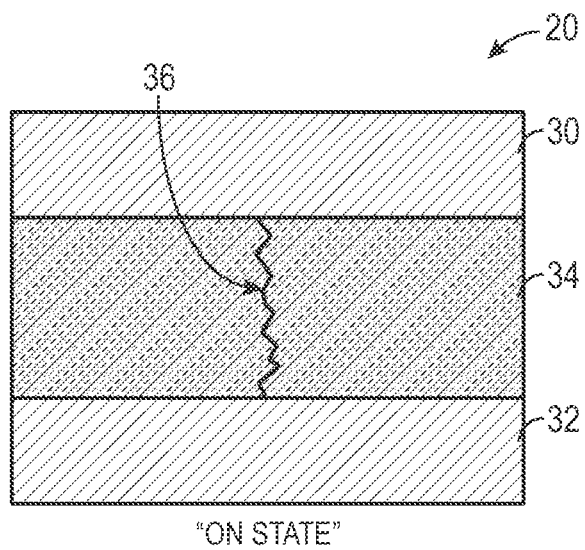

The structure and dimensionality of the conductive paths may be described as being dendritic or tortuous. For instance, the structure of the conductive path may reflect the probabilistic outcome of a series of stochastic events (e.g., similar to the formation of a lightning bolt). To better illustrate the transition between ON and OFF states for RRAM memory cells, FIGS. 3A and 3B provide simplified illustrations showing the formation of a conductive filament-shaped pathway within an active layer. For instance, FIG. 3A shows a memory cell 20 in an OFF state. Here, the memory cell 20 includes an upper electrode 30 and a lower electrode 32, with an active layer 34 disposed therebetween. In the OFF state, the active layer 34 is insulating. When an activating voltage is applied, the memory cell 20 may transition to an ON state, as shown in FIG. 3B. Here, the active layer 34 transitions to a low resistive state (the ON state) and a conductive pathway 36 is formed within the active layer 34, thus providing a conductive path between the upper electrode 30 and lower electrode 32.

As will be appreciated, the geometric and electronic properties of the conductive pathways may be material and system dependent. For example, in some embodiments, the conductive pathways may be metallic in nature (e.g., a conductor) and formed via electro-migration of metal ions through the active layer (e.g., an electrolyte) with electro-chemical reduction at the electrode interfaces. In other embodiments, the active layer may include a mixed valence oxide, and the change in resistive state may be due to a result of local change of oxidation states (e.g., due to the drift of oxygen anions or vacancies in response to an applied electric field) of one or more components (e.g., the electrodes and/or the active layer material). The latter two examples may be referred to as oxidation-reduction (redox) reactions. In further embodiments, a conductive pathway may be formed as a chain of energetically accessible sites within the active layer material, along which charged species (e.g., electrons and ions) are transported by either diffusive hopping (e.g., phonon-assisted hoping), or trap-assisted tunneling.

Regardless of the transport mechanism within the memory cell 20, the conductive pathways formed may have particular geometric characteristics that may be associated with one or more material length scales ($\lambda_C$), which may define a quasi-unit of material sufficient for facilitating a transport event. For instance, the non-volatile memory industry continues to trend toward the design of memory devices having smaller and smaller cell dimensions with higher densities, such as 3X or 4X nm nodes or less (e.g., where X=0-9). From an integrated circuit scaling and design perspective, when the memory cell size (f) is reduced to the same order as the characteristics material length scale(s) (e.g., $f-\lambda_C$), material and transport properties may deviate from expected "bulk" properties (e.g. properties expected in materials at greater scale lengths). This may be attributable, at least in part, to the breakdown of continuum behavior at such nanoscopic dimensions, and may lead to increased cell-to-cell variability. As discussed further below, certain embodiments of the invention may relate to techniques for implementing (e.g., designing and manufacturing) RRAM memory cells with characteristic material length scales of smaller than the cell size, e.g., on the order of one nanometer.

In accordance with one embodiment of the present invention, resistive memory cells (RRAM cells) may be implemented using a vertically oriented cell structure, where multiple adjacent vertical cell structures may collectively form a three-dimensional memory array. For example, referring to FIG. 4, a cross-section showing a portion of an embodiment of a vertical memory cell structure 38 is illustrated. As indicated by the corresponding schematic to the left of the cross-sectional drawing, the vertical memory cell structure 38 may define the memory cells 20a and 20b of the array 12 shown in FIG. 1. For instance, the structure 38 may include a first dielectric layer 40a above which the word line WL(1) 22b is formed. A second dielectric layer 40b is formed above the word line WL(1) and provides insulation from the word line WL(0) 22a. As discussed further below, each vertically adjacent word line 22 may constitute a "tier" of the illustrated multi-tier vertical cell structure 38. As further depicted in FIG. 4, the word lines 22 have a height referred to herein as $\delta_{WL}$, and the dielectric layers 40 have a height referred to herein as $\delta_{INS}$.

The variable resistive elements 28 are depicted as a conformal active layer 44 that surrounds a via 42. Thus, a first memory cell 20a is represented by the word line WL(0) and the via portion 42a, which represents first and second electrodes, respectively, and the active area 46a of the active layer 44 that is disposed between the word line WL(0) and the via portion 42a. Similarly, the second memory cell 20b is represented by the word line WL(1), the via portion 42b, and the active area 46b disposed therebetween.

In the illustrated embodiment, the active layer 44 also includes multiple grain boundaries, represented here by elements 48. As will be appreciated, grain boundaries may refer to interfaces between crystallites in polycrystalline materials. In certain embodiments where the active layer 44 includes transition metal oxides, chalcogenides, or perovskite materials, conductive pathways may tend to form generally along grain boundaries within the active layer 44, although the pathways may still be characterized as dendritic or tortuous within the interface of the grain boundary. To provide an example, the segregation of nickel at grain boundaries in nickel-oxide (NiO) may be attribute to the formation of conductive filaments leading to negative differential resistance and bistable switching in a platinum-nickel-oxide-platinum (Pt—NiO—Pt) structure. In another example, excess antimony (x) for a $Ge_2Sb_{2+x}Te_5$ thin film may phase-separate at the grain boundaries between $Ge_2Sb_2Te_5$ crystallites, thus forming a conductive pathway attributable to bipolar switching properties of solid-state electrolytic devices. In both of these examples, the material that forms the conductive grain boundary filaments may be incorporated using stoichiometric control during a film deposition process. In other embodiments, non-volatile RRAM memory cells may also be fabricated by performing post deposition implantation of desired metal ions into the grain boundaries of the active layers. Further, in some embodiments, the active layer 44 may include an amorphous material, such as a metal oxide having metal ratios that vary locally within the active layer 44.

Figure 4:
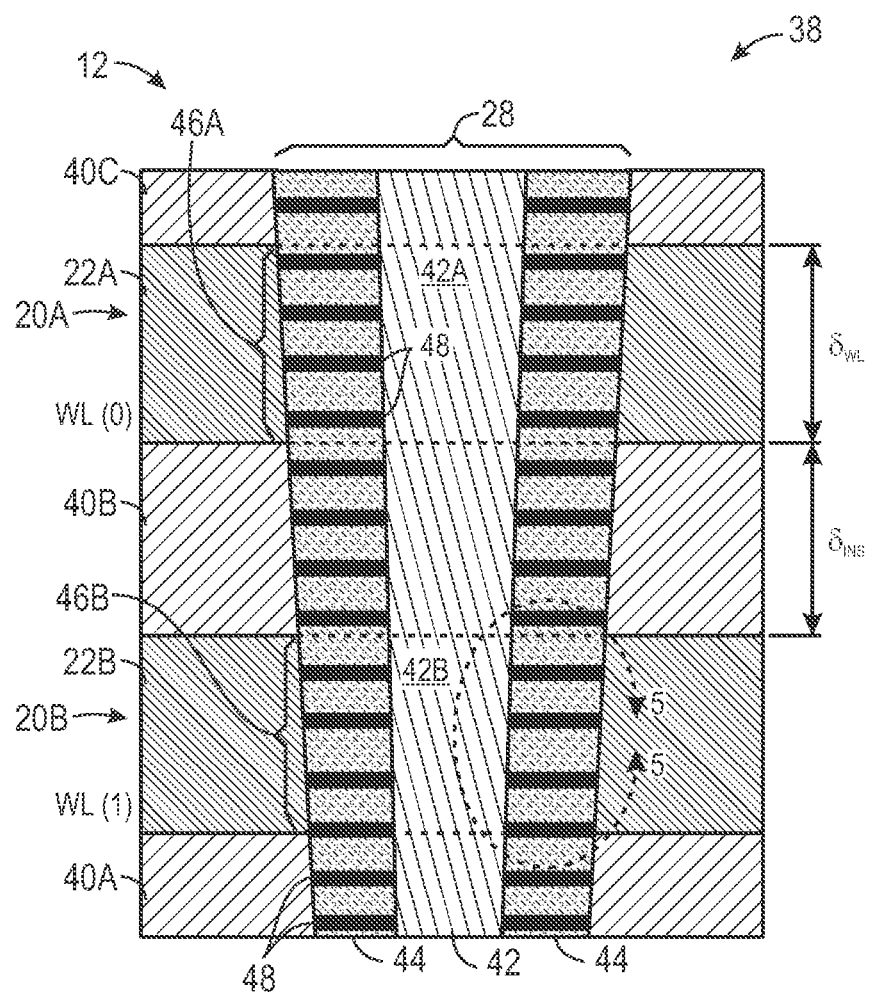
FIG. 4 is a partial cross-sectional view of a vertical memory cell structure that includes multiple memory cells in accordance with an embodiment of the present invention.

In the embodiment shown in FIG. 4, the active layer is formed as a conformal thin film that utilizes a columnar grain structure. Using this type of structure, the grain boundaries 48 extend generally linearly and perpendicularly between generally parallel electrode interfaces, i.e., in the direction of the electric field applied during device operation, and are also parallel to the surface (plane) of a substrate (not shown in FIG. 4 upon which the memory cells are formed. For instance, referring to the memory cell 20a, the grain boundaries 48 within the active area 46a are generally linear and perpendicular to the interfaces of the word line WL(0) and the via portion 42a. In these types of embodiments, the utilization of straight grain boundaries that are oriented parallel to the applied electric field may reduce $\lambda_C$ by reducing and limiting the lateral dispersion of electromigratory particles forming the conductive pathways (e.g., filament-shaped or area-distributed (interfacial) pathways). For instance, the structure and orientation of the grain boundaries 48 within the active material 44 of the present embodiment may enable the formation of a one-dimensional filament-shaped pathway with an effective tortuosity of unity. In other words, the orientation of the grain boundaries 48, as shown in the embodiment of FIG. 4, may provide reversible conductive pathways that are generally straight and parallel to the linear grain boundaries, at least in an ideal case. In practice, the conductive pathways may sometimes still exhibit some degree of tortuosity, though significantly less than a cell design that does not utilize the columnar grain structure depicted in the present embodiment.

As will be appreciated, in the context of nanoscopic solid-state design that utilizes conductive filamentary pathways (e.g., certain types of RRAM devices, as discussed in the examples above), an ideal scaling limit of such filamentary memory devices, is the diameter of a filament or the thickness of the grain boundary, which is not the case when the tortuosity of the conductive filament exceeds unity. To realize this scaling limit in conventional design techniques, not only is a grain size of this order needed, but the ability to position or register grain boundaries within the cross-points of cell electrodes is also required. For instance, in the absence of grain boundary registration in conventional nanoscopic design techniques, the presence of a grain boundary within a cell is subject to increasing random variability, due to continuum behavior breakdown as cell size decreases. For instance, without grain boundary registration, there exists a possibility that a memory cell may form without a corresponding grain boundary, which may prevent or significantly reduce the probability of a conductive pathway forming between the electrodes of the cell. Additionally, as memory devices continue to scale down to smaller dimensions, grain boundary concentrations may reach a maximum density, which makes grain boundary registration increasingly difficult and challenging. In this regard, several factors that may be considered in the design of such devices include: (1) the number of grain boundaries within a cell, (2) the tortuosity of grain boundaries, (3) the orientation of the grain boundaries, and (4) the location of the grain boundaries with respect to the electrode interfaces.

Further, rather than relying solely upon grain boundary registration, embodiments of the present disclosure provide techniques that may be used in conjunction with the vertical memory cell structure 38 depicted in FIG. 4, which may provide for controlling the height of the word lines 22, $\delta_{WL}$, to retain apparent continuum material behavior and without increasing the overall aerial footprint of the memory cell 20. For instance, the vertically oriented nature of the presently illustrated cell structure 38 may enable the cell area to be increased by increasing $\delta_{WL}$. In one embodiment, $\delta_{WL}$ may selected such that at least two conditions are satisfied: (1) there is an acceptable probability (~100%) of creating a grain boundary within each memory cell 20, and (2) there is an acceptable probability (~100%) that the created grain boundary is suitable for formation of a conductive pathway. As will be appreciated, when the former condition is satisfied such that two or more grain boundaries are created for each memory cell 20, then a degree of redundancy is provided. Thus, by selecting $\delta_{WL}$ to satisfy both of the above conditions, the cell area may be increased (vertically) such that the interface between the word line (e.g., 22a) and the active area (e.g., 46a) is increased, and such that the electrical response is averaged over multiple grain boundaries in an effective continuum manner and decreasing cell-to-cell variability, even for cells of nanoscopic dimensions and even in cases where grain boundary density is maximized. By way of example only, $\delta_{WL}$ may be selected in certain embodiments as being between approximately 5 to 100 nm, between 5 to 70 nm, or between 10 to 50 nm.

Figure 5:
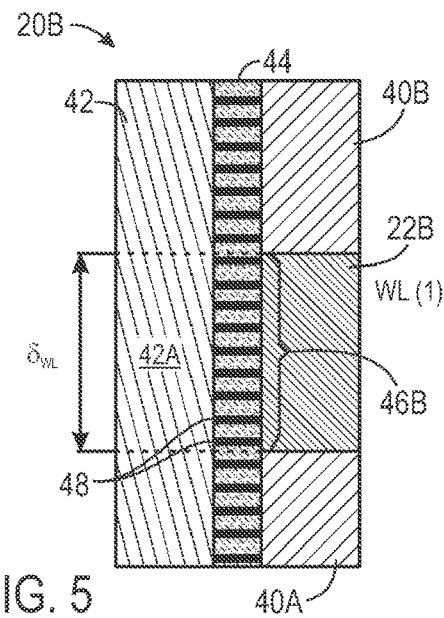
FIG. 5 is a more detailed cross-sectional view that focuses on the region enclosed by the line 5-5 of FIG. 4 and illustrates a first cell geometry that may be implemented in an RRAM memory cell, in accordance with an embodiment of the present invention.
Figure 7:
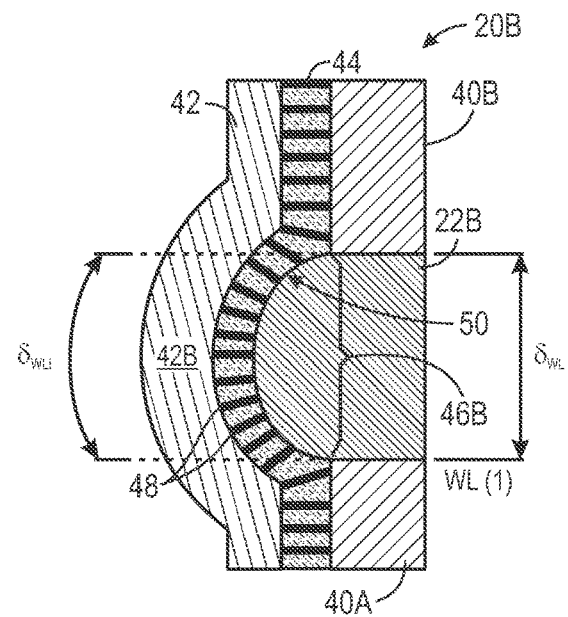
FIG. 7 is a more detailed cross-sectional view that focuses on the region enclosed by the line 5-5 of FIG. 4 and illustrates a second cell geometry that may be implemented in an RRAM memory cell, in accordance with another embodiment of the present invention.
Figure 8:
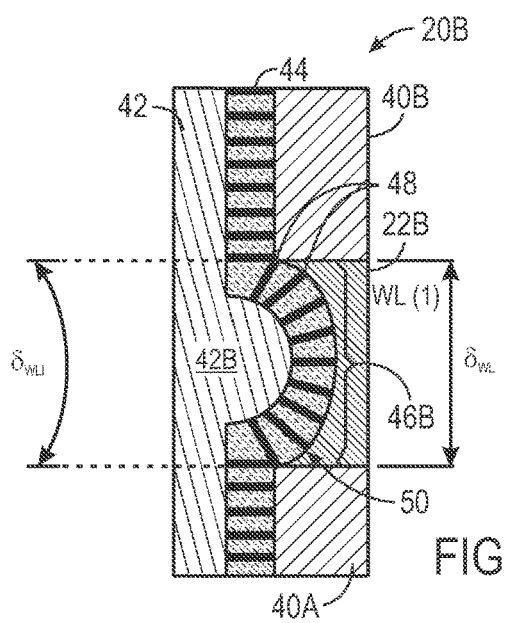
FIG. 8 is a more detailed cross-sectional view that focuses on the region enclosed by the line 5-5 of FIG. 4 and illustrates a third cell geometry that may be implemented in an RRAM memory cell, in accordance with yet another embodiment of the present invention.
Figure 6:
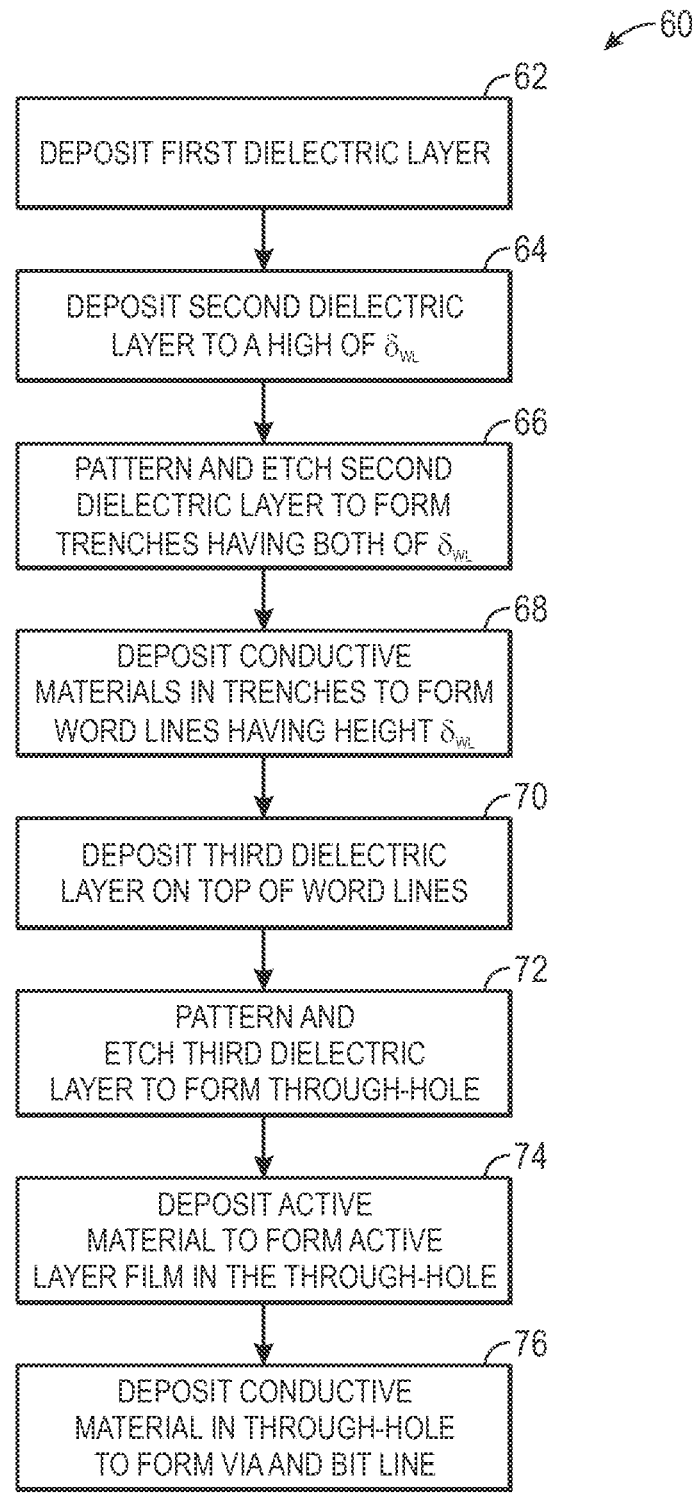
FIG. 6 is a flow chart depicting a process that may be used for fabricating the memory cell shown in FIG. 5 in accordance with an embodiment of the present invention.
Figure 9:
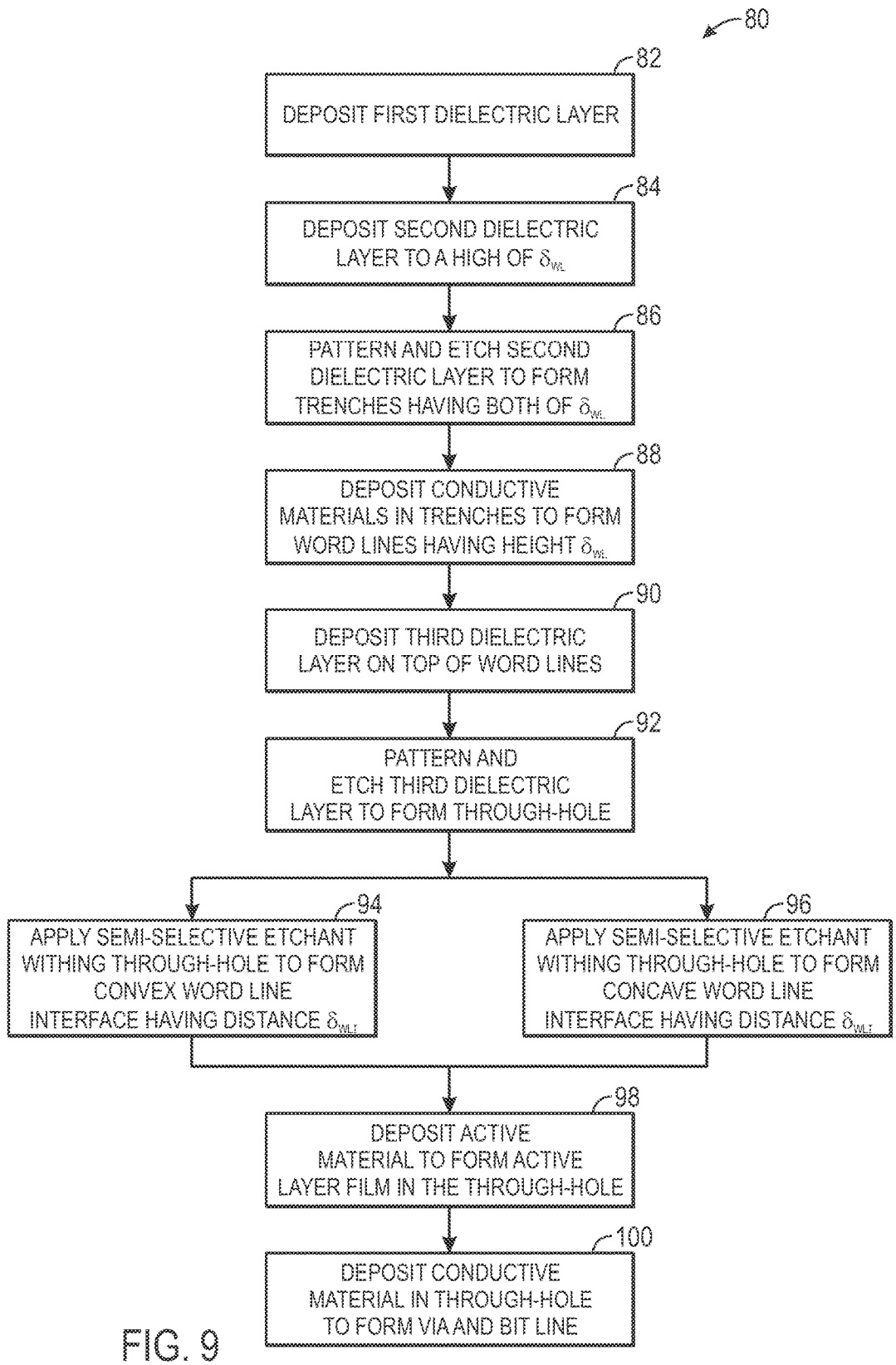
FIG. 9 is a flow chart depicting a process that may be used for fabricating the memory cells shown in FIGS. 7 and 8, in accordance with an embodiment of the present invention.

With this in mind, FIGS. 5, 7 and 8 depict cross-sectional views of several different embodiments for increasing the word line height $\delta_{WL}$, while FIGS. 6 and 9 provide flow charts describing processes for forming an RRAM memory cell in accordance which each of the embodiments depicted in FIGS. 5, 7 and 8. Further, it should be noted that the embodiments depicted in FIGS. 5, 7, and 8 are intended to illustrate in more detail the region of the memory cell 20b enclosed within line 5-5 of FIG. 4.

FIG. 5 illustrates the memory cell 20b in greater detail, wherein the height $\delta_{WL}$ of the word line 22b is selected such that it satisfies the two conditions discussed above. A technique for fabricating a memory cell in accordance with the embodiment shown in FIG. 5 is described in FIG. 6 by way of a flow chart depicting the process 60. With regard to the process steps shown in FIG. 6, it should be appreciated that any suitable photolithography techniques may be employed to carry out the illustrated steps. As shown, the process 60 begins at step 62 with the deposition of a first dielectric layer. With reference to FIG. 5, the deposition of the dielectric layer at step 62 may correspond to the formation of the dielectric layer 40a. At step 62, a second dielectric layer is deposited on the first dielectric layer to a height equivalent to the desired word line height, $\delta_{WL}$. By way of example only, the first and second dielectric layers may include a silicon oxide material (e.g., $SiO_2$). Then, at step 66, the second dielectric layer is patterned, such as by using a photoresist material, and subjected to an etching process to form trenches having a depth of $\delta_{WL}$. Thereafter, at step 68, a conductive material, such as titanium nitride (TiN) may be deposited using any suitable process, such as chemical vapor deposition (CVD) or physical vapor deposition (PVD) processes.

As will be appreciated, at step 68, following the deposition of the conductive material, the conductive material may be planarized (e.g., using a chemical-mechanical polishing (CMP) step) so that the top surface is planar with the top surface of the second dielectric layer. Thus, the deposition of the conductive material within the trenches at step 68 results in the formation of word lines (e.g., word line 22b of FIG. 5) having the desired height $\delta_{WL}$. Further, in other embodiments, the first and second dielectric layers need not necessarily be formed as separate layers in separate steps. For instance, in one embodiment, a single dielectric layer having a height greater than $\delta_{WL}$ is formed, and the trenches are etched to a depth of $\delta_{WL}$ for formation of the word lines at step 68.

Next, at step 70, a third dielectric layer (e.g., $SiO_2$) may be formed above the word lines and second dielectric layer. For instance, the third dielectric layer may correspond to dielectric layer 40b in FIG. 5. It should be understood that additional tiers or levels of word lines (e.g., word line 22a) may be formed above the third dielectric layer by generally repeating steps 62-70 for each additional tier. For instance, a vertical cell structure 38, such as the embodiment shown in FIG. 4, may include several tiers of word lines and memory cells based on a single via connecting to all tiers. By way of example only, a vertical cell structure in accordance with the present techniques may include between 2 to 10 tiers or more. However, for sake of simplicity, the process 60 describes the formation of only a single tier structure with one memory cell.

Once the third dielectric layer is formed, the top surface of the third dielectric layer is patterned and etched to form a through-hole at step 72. Subsequently, at step 74, an active material having the desired columnar grain structure (e.g., NiO) is deposited over the cell structure as a conformal thin film, such that the active material lines the side-walls of the through-hole, forming an active layer for the RRAM memory cell (e.g., 20b). Finally, a conductive material is deposited in the through-hole to form a via and bit line at step 76, thus completing the fabrication of the RRAM memory cell 20b shown in FIG. 5. Though it may not be truly accurate to refer to the structures formed at steps 72 and 76 as a through-hole and via, respectively, in the case of a single tier memory cell structure, such a reference is made to demonstrate that the present technique is well suited for forming multiple-tier vertical cell structures.

Referring now to FIGS. 7 and 8, additional embodiments for increasing cell area to provide a sufficient number of grain boundaries are illustrated. Particularly, it should be noted that the embodiments depicted in FIGS. 7 and 8 may increase cell area by utilizing a cell geometry that changes the shape of the word line-to-active area interface instead of or in addition to providing a word line height $\delta_{WL}$ that satisfies the above-discussed conditions for maintaining apparent continuum behavior and reducing cell-to-cell variability in such vertical cell structures.

For instance, referring first to FIG. 7, the word line 22b is formed such that the surface 50 interfacing with the active area 46b has a convex shape. As will be appreciate, this shape may be formed by, prior to deposition of the via 42 and active layer 44, applying an etchant to the side walls of the through-hole that is capable of etching both the dielectric layers 40a, 40b and the word line 22b, but is more selective to the dielectric layers 40a, 40b. In other words, the etching process may remove portions of the dielectric layers 40a, 40b at a rate that is faster than the removal of portions of the word line 22b, thus resulting in the word line interface 50 having a convex surface. Therefore, due to the curvature of the convex surface 50, the overall distance of the word line interface surface, referred to here as $\delta_{WLI}$ may be greater than the height $\delta_{WL}$ of the word line. Thus, while the embodiment shown in FIG. 7 may be implemented such that $\delta_{WL}$ satisfies the two conditions mentioned above (e.g., provides ~100% probability of creating a grain boundary and provides ~100% probability that a conductive pathway may form at the created grain boundary), it may only be necessary to configure the memory cell 20b, such that the word line interface distance $\delta_{WLI}$ satisfies these two conditions. That is, as long as the distance $\delta_{WLI}$ is sufficient, the height $\delta_{WL}$ shown in FIG. 7 may be less than the height $\delta_{WL}$ of FIG. 5 while still maintaining the desired memory cell properties.

FIG. 8 shows another embodiment of the memory cell 20b that is similar to the embodiment shown in FIG. 7, but provides a cell geometry in which the word line 22b is formed such that the surface 50 interfacing with the active area 46b has a concave shape. The concave shape of the word line interface 50 shown here may be formed by, prior to deposition of the via 42 and active layer 44, applying an etchant to the side walls of the through-hole that is capable of etching both the dielectric layers 40a, 40b and the word line 22b, but is more selective to the word line 22b. That is, the etchant may remove portions of the word line 22b at a faster rate than the removal of portions of the dielectric layers 40a, 40b, thereby creating the concave word line interface 50. Further, as shown in FIG. 8, the curved nature of the word line interface surface 50 results in a distance $\delta_{WLI}$ that is greater than the height $\delta_{WL}$ of the word line 22b. For the same reasons discussed above with regard to the embodiment shown FIG. 7, the memory cell 20b of FIG. 8 may be configured such that either both the height $\delta_{WL}$ and the distance $\delta_{WLI}$, or only the distance $\delta_{WLI}$, satisfies the above-discussed conditions for maintaining apparent continuum behavior and reducing cell-to-cell variability in such vertical cell structures.

Referring to FIG. 9, a flow chart illustrating a process 80 for forming an RRAM memory cell in accordance with the embodiments depicted in FIGS. 7 and 8 is illustrated. As will be appreciated, steps 82-92 of the process 80 are substantially identical to the steps 62-72 of the process 60 shown in FIG. 6 except, as discussed above, the height $\delta_{WL}$ alone need not necessarily satisfy the conditions discussed above provided that the distance $\delta_{WLI}$ of the resulting word line interface surface 50 does satisfy the above-discussed conditions. Following step 92, at which the third dielectric layer (e.g., 40b) is patterned and etched to form a through-hole, the process 80 may proceed to step 94 or 96, depending on the desired shape of the word line interface surface 50. For instance, if a convex interface surface (FIG. 7) is to be formed, the process 80 branches to step 94, and a semi-selective etchant that etches the dielectric layers (e.g., 40a, 40b) at a faster rate than the word line (e.g., 22b) is applied within the through-hole, resulting in the convex word line interface 50, as shown in FIG. 7, having a curved vertical distance $\delta_{WLI}$ that satisfies the conditions for maintaining apparent continuum behavior and reducing cell-to-cell variability in such vertical cell structures.

Alternatively, if instead the concave word line interface surface is to be formed, then the process 80 continues from step 92 to step 96. At step 96, a semi-selective etchant is also applied, but this one being configured to etch the word line (e.g., 22b) material at a faster rate than the dielectric layers (e.g., 40a, 40b), thus providing the resulting concave word line interface surface 50 shown in FIG. 8. Like the convex surface of FIG. 7, the concave surface of FIG. 8 also exhibits a curved vertical distance $\delta_{WLI}$ that satisfies the conditions for maintaining apparent continuum behavior and reducing cell-to-cell variability in such vertical cell structures. Thereafter, subsequent to either of steps 94 or 96, the process 80 continues to step 98, where an active material (e.g., NiO) having a desired columnar grain structure is deposited over the cell structure as a conformal thin film, such that the active material lines the side-walls of the through-hole, which may include either convex or concave word line interface surfaces 50. At step 100, a conductive material is deposited in the through-hole to form a via and bit line, thus completing the fabrication of the RRAM memory cell 20b shown in either FIG. 7 or 8.

Figure 10:
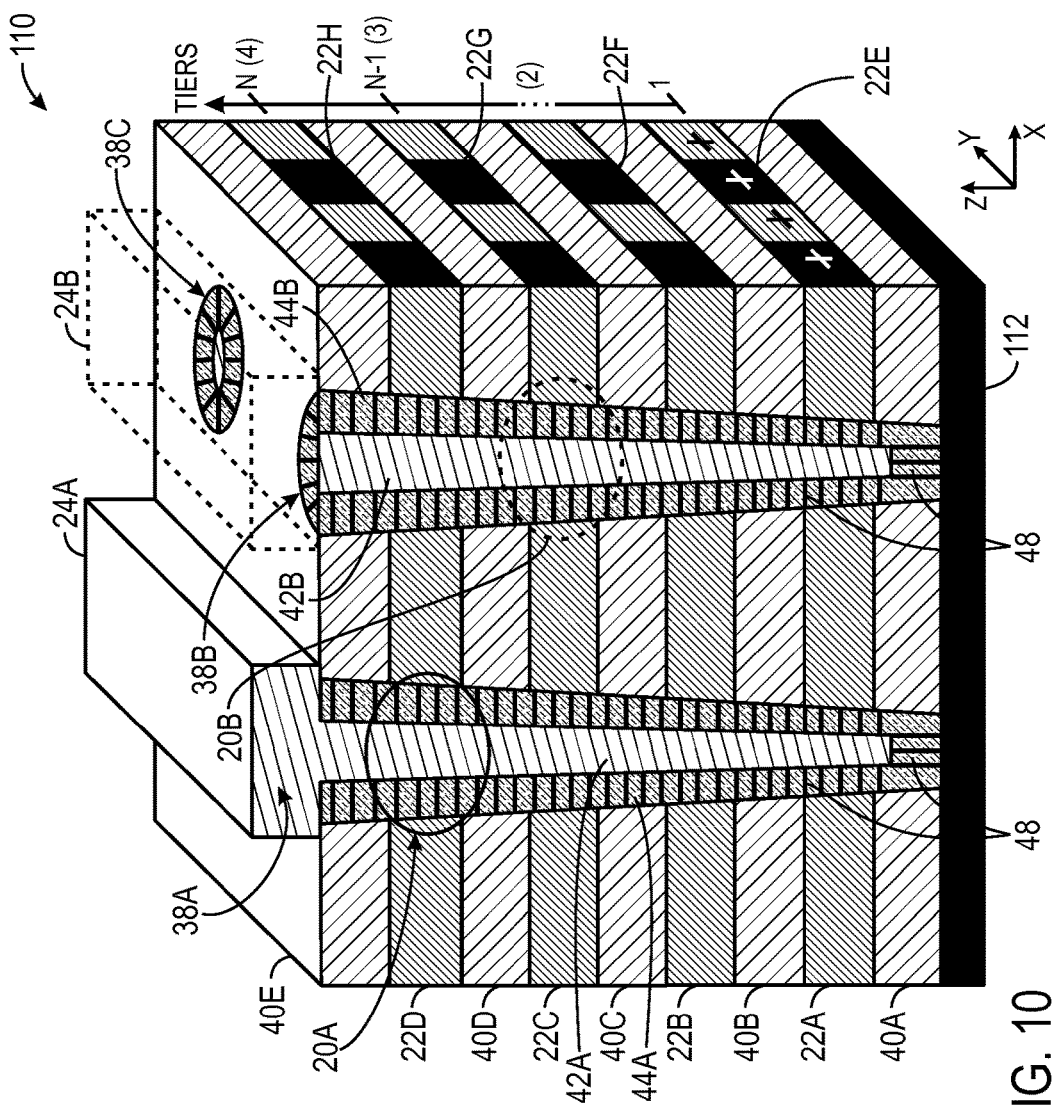
FIG. 10 illustrates a multiple-tier three-dimensional RRAM memory array in accordance with an embodiment of the present invention.

As discussed, the various techniques described herein may be used to form a vertical cell structure 38 (FIG. 4). Further, the grain boundary-oriented vertical memory cell described herein may be integrated into any number of single-tier or multiple-tier cross-point memory architectures. For instance, a multiple-tier three-dimensional array 110 that may integrate the memory cell embodiments described herein is illustrated in FIG. 10.

The illustrated array 110 includes the dielectric layers 40a-40e and word lines 22a-22h defining four tiers. For instance, a first tier includes the word lines 22a and 22e, a second tier includes the word lines 22b and 22f, a third tier includes the word lines 22c and 22g, and a fourth tier includes the word lines 22d and 22h. As shown, the word lines 22 in each respective tier are parallel to one another. Further, while only four tiers are depicted in the illustrated example, those skilled in the art will appreciate that the present techniques may extend to the implementation of a three-dimensional memory array with vertical cell structures that span greater or fewer tiers.

The three-dimensional memory array 110 includes bit lines 24a and 24b (shown in phantom). Additionally, the three-dimensional memory array 110 includes the vertical cell structures 38a, 38b, and 38c, which may be fabricated using any of the memory cell geometries and manufacturing techniques described above with reference to FIGS. 4-9. As shown, the vertical cell structures 38a and 38b lie in the same x-z plane and are coupled to the same word lines 22a-22d, but to different bit lines 24a and 24b, respectively. Due to the four-tier configuration, each vertical cell structure 38 may define four memory cells 20, with one memory cell located in each tier. For instance, the memory cell 20a of the vertical cell structure 38a is located in tier 4 and along word line 22d, and the memory cell 20b of the vertical cell structure 38b is located in tier 3 and along word line 22c.

As will be appreciated, the memory cells (e.g., 20a, 20b) include an active layer 44 and a via 42 defining a conductor, and may be formed using any of the techniques described above. For instance, the memory cells 20 may be formed in accordance with the embodiment shown in FIG. 5, wherein the word lines 22 have a height $\delta_{WL}$ that satisfies the above-discussed conditions for maintaining apparent continuum behavior and reducing cell-to-cell variability in such vertical cell structures by providing ~100% probability of creating a grain boundary and provides ~100% probability that a conductive path may form at the created grain boundary. As discussed above with reference to FIG. 4, the grain boundaries may be oriented such that they are generally perpendicular with respect to the first and second electrodes and generally parallel to the plane of the substrate 112 on which the memory cells 20 are formed. Further, the memory cells 20 may also be formed in accordance with the embodiments shown in FIGS. 7 and 8, in which the word line-to-active layer interface (e.g., 50 in FIGS. 7 and 8) exhibit either a convex or concave surface having an overall distance $\delta_{WLI}$ that also satisfies the continuum behavior and cell-to-cell variability reduction conditions. Additionally, in further embodiments, a combination of such techniques may be used. For instance, in one embodiment, a word line 22 may have a sufficient word line height $\delta_{WL}$, but also a concave or convex interface surface 50.

As further shown in the three-dimensional array of FIG. 10, additional vertical cell structures are also present in the array 110. For instance, the vertical cell structure 38 c may lie in the same y-z plane and may be coupled to the same bit line 24 b as the vertical cell structure 38 b, but to a different set of word lines 22 e-22 f. Additionally, another vertical cell structure 38 d, which is not visible in FIG. 10, may be located in the same y-z plane as the vertical cell structure 38 a and coupled to the bit line 24 a. Further, while the presently illustrated array 110 depicts the formation of the vertical cell structures 38 by the conformal deposition of a via into a cavity. The cavity refers to an opening formed through the vertical cell structure. For example, the cavity may include an opening, such as a through-hole (e.g., the via), slot, or trench.

Additionally, each of the vertical cell structures 38 shown in the embodiment of the three-dimensional resistive memory array 110 shown in FIG. 10 is depicted as including a single film active layer 44 with columnar grain structures defining grain boundaries that extend parallel to the direction of electrical fields between electrodes (e.g., a word line 22 and a via portion of a memory cell 20). In such embodiments, it should be understood that the single film active layer is formed to be sufficiently insulating such that upper and lower cells within the same vertical structure 38 do not short (e.g., conduction perpendicular to the grain boundaries does not occur). In further embodiments, the active layer 44 may not necessarily be sufficiently insulating in this regard. For instance, the active layer 44, or one of the films in the active layer 44, may include a conductive metal oxide (CMO). In such embodiments, the continuous conformal active layer illustrated above may be replaced by selective deposition of the conductive active material only onto the word lines 22. For example, such a process may be performed using electroless deposition techniques. Further, instead of or in addition to selective deposition of the active layer, a thin insulating film, such as an insulting metal oxide (IMO) may be deposited between the active area of a memory cell 20 and either or both of the cell electrodes (e.g., word line or via interface).

Figure 11:
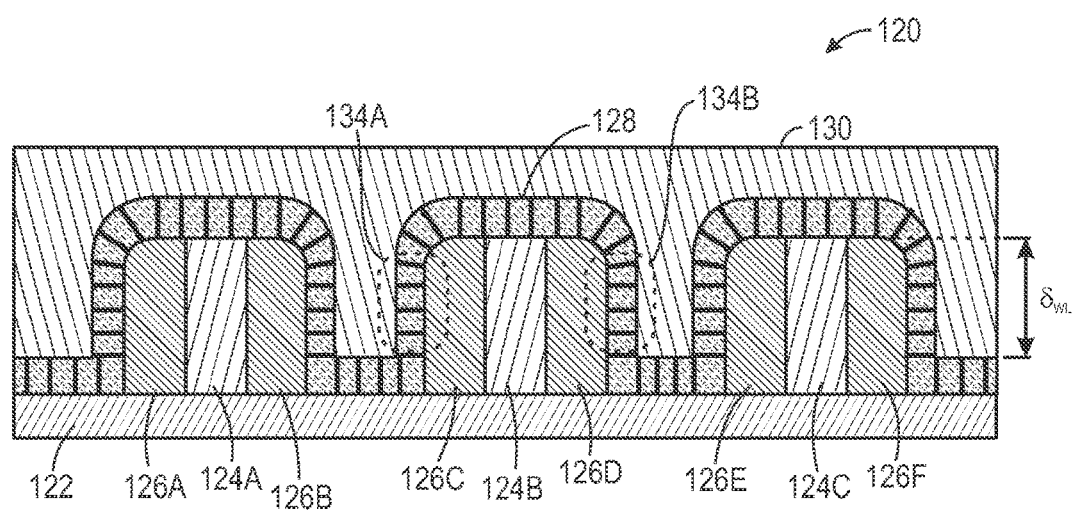
FIG. 11 illustrates a spacer double-pitched RRAM memory array in accordance with an embodiment of the present invention.

A further embodiment of a memory device 120 that may integrate grain boundary oriented vertical memory cells is illustrated in FIG. 11. As shown, a memory device 120 includes a substrate 122 and dielectric features 124 upon which word line conductors 126 and an active layer cell material 128, which may exhibit the columnar grain boundary orientation properties discussed above, are formed. The word lines 126 may be formed using a spacer methodology. After the word lines 126 and cell materials 128 are formed, a conductive material forming a bit line 130 may be deposited and patterned accordingly (or may be patterned first and then deposited if a damascene fill technique is utilized). The resulting structure, as shown in FIG. 11, may thus provide a binary cell layer with two RRAM cells centered about each dielectric feature 124. By way of example, the present technique results in the RRAM cells 134a and 134b being formed about the dielectric feature 124b. For instance, the memory cell 134a may be defined as the bit line 130 (first conductor) and the word line 126c (second conductor), with the active material 128 being disposed therebetween.

These types of memory cell structures may be referred to as a spacer pitch-doubled memory array. As can be appreciated, the cells 134 may be formed in accordance with one or more of the techniques discussed above. For instance, the word line height $\delta_{WL}$ may be set to ensure that the above conditions for creating a grain boundary suitable for formation of a conductive pathway are met. Further, while FIG. 11 illustrates a single tier of a spacer pitch-doubled memory array 120, a memory chip (e.g., 10 of FIG. 2) may include multiple tiers of such vertical memory cell arrays. For instance, additional tiers may be formed over the bit line 130.

Figure 12:
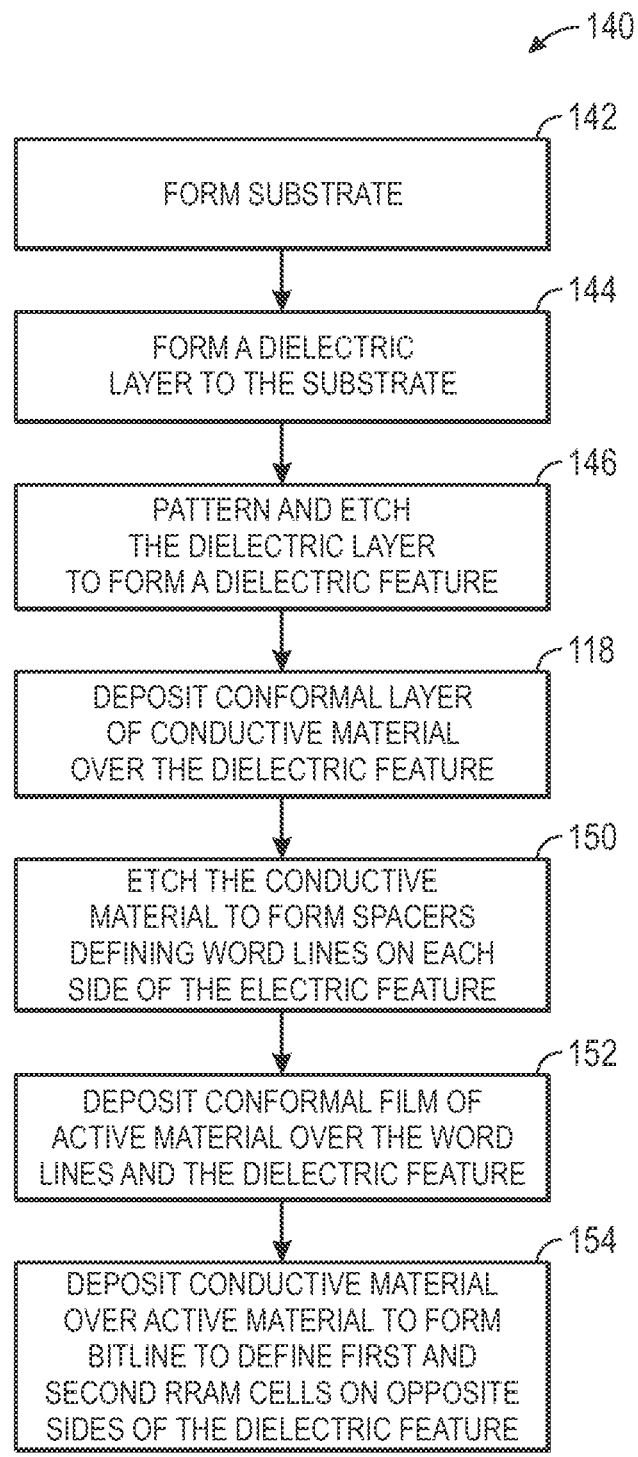
FIG. 12 is a flow chart depicting a process that may be used to fabricate the spacer double-pitched RRAM memory array of FIG. 11 in accordance with an embodiment of the present invention.

The fabrication of the spacer pitch-doubled memory device 120 of FIG. 11 may be better understood with reference to FIG. 12, which illustrates a process 140 for fabricating a spacer pitch-doubled memory device 120 and to FIGS. 13-17, which depict a series of semi-conductor processing steps for forming a spacer pitch-doubled memory device 120. Accordingly, the process 140 shown in FIG. 12 will now be described in conjunction with the steps shown in FIGS. 13-17.

Figure 13:
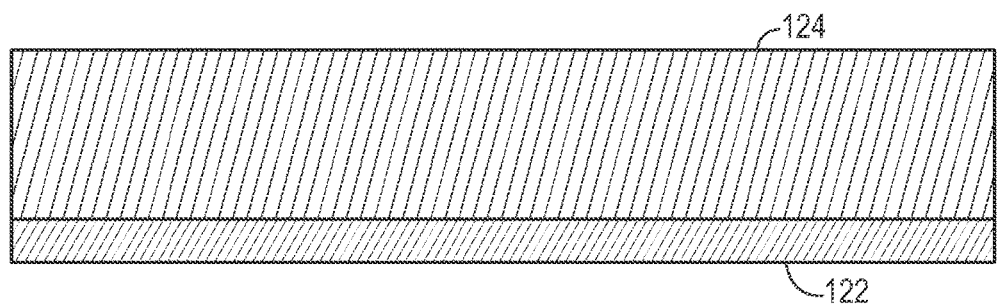
FIGS. 13-17 show a series of semiconductor processing steps that may be performed to manufacture the spacer-based RRAM memory array of FIG. 11 in accordance with an embodiment of the present invention.
Figure 14:
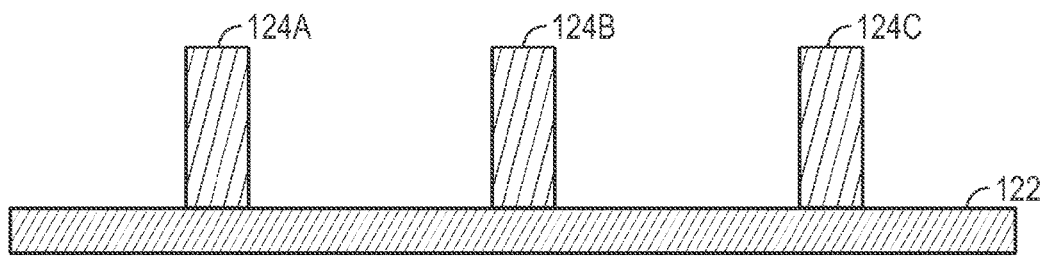

As shown, the first step 142 of the process 140 includes the formation of a substrate followed by the formation of a dielectric layer upon the substrate at step 144. These steps are illustrated by FIG. 13, which shows the formation of the substrate 122 and the dielectric layer 124. As will be appreciated, any suitable deposition technique may be used to form the substrate 122 and the dielectric layer 124, including chemical deposition techniques (e.g., CVD) or physical deposition techniques (e.g., PVD, sputtering, etc.). Thereafter, at step 146, the dielectric layer formed at step 144 is patterned and etched to form a dielectric feature. FIG. 14 provides an example of a dielectric feature (e.g., 124a, 124b, 124c) that may be formed as a result of performing step 146 on the structure shown in FIG. 13.

Figure 15:
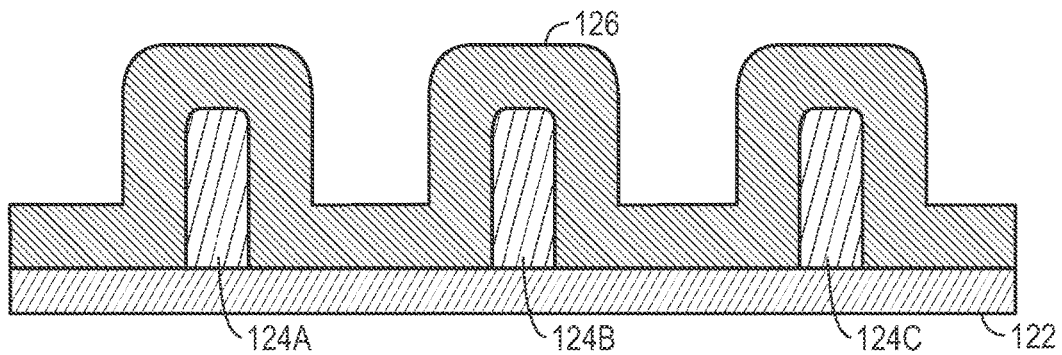
Figure 16:
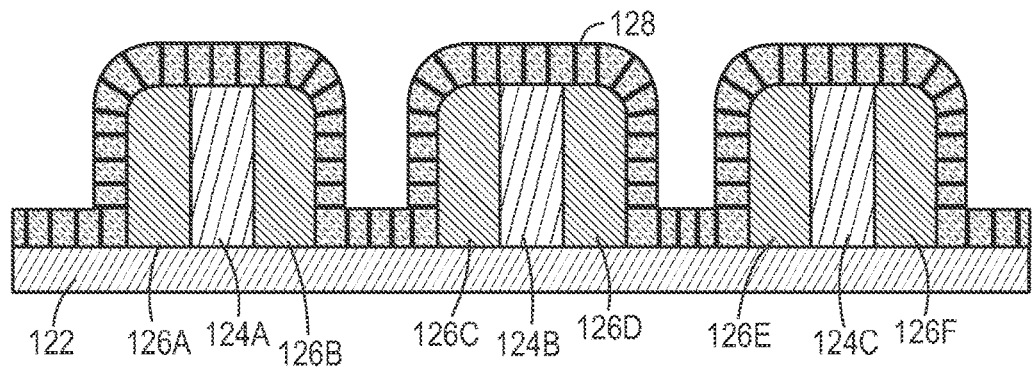
Figure 17:
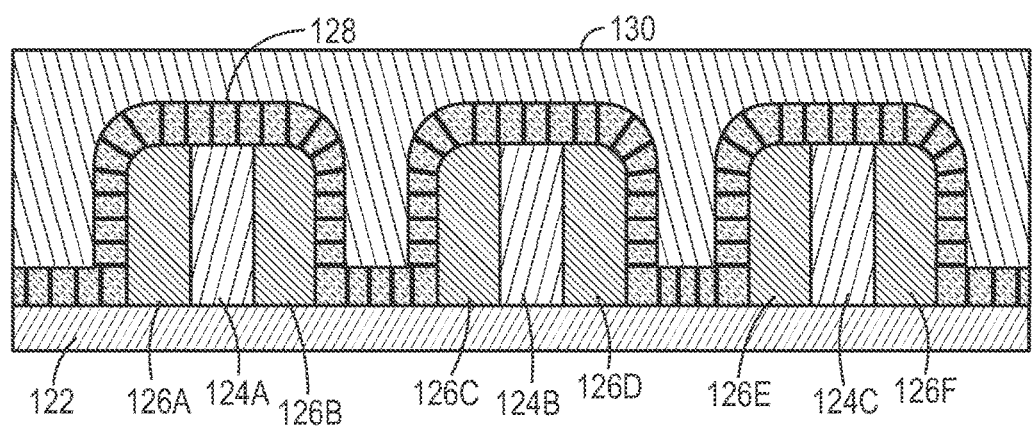

Next, at step 148, a conformal layer of conductive material is deposited over the dielectric feature. Again, any suitable chemical or physical deposition technique may be employed to form the conductive material. To provide an example, FIG. 15 shows the result of depositing the conformal layer of conductive material 126 over a dielectric feature (e.g., 124a-124c). Subsequently, the process 140 continues to step 150, at which the conductive material layer 126 is etched using a spacer methodology to form spacers defining word lines on either side of the dielectric feature. For instance, referring to FIG. 16, the formation of the spacers on either side of the dielectric feature 124b results in the formation of the word line 126c and the word line 126d. Continuing to step 152 and referring still to FIG. 16, a conformal film of active material 128 is deposited over the word lines and the dielectric feature. Subsequently, at step 154, a conductive material is formed over the active material 128 to form the bit line 130, as shown in FIG. 17. Thus, as discussed above, the resulting structure provides a binary cell layer in which two RRAM cells (e.g., 134a, 134b) are formed, each being on opposite sides of a dielectric feature (e.g., 124b).

In the illustrated embodiment, a single film active layer 128 is shown and may be assumed to be sufficiently insulating such that shorts between adjacent word lines (e.g., 126c and 126d) are avoided. That is, the active layer 128 is sufficiently insulating to prevent conduction perpendicular to the grain boundaries. In one embodiment, a sufficiently insulating active layer 128 may include nickel oxide (NiO).

Figure 18:
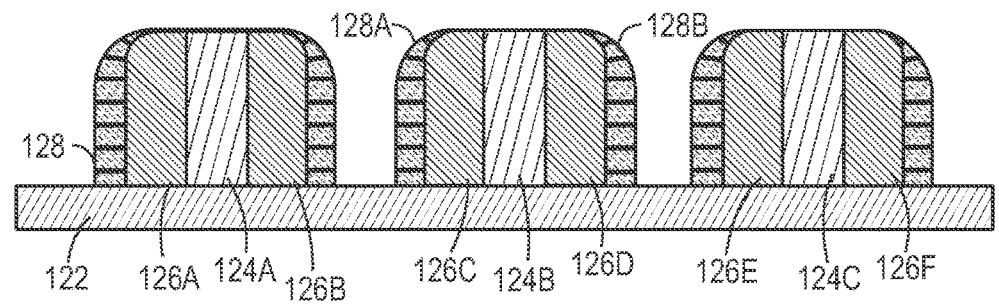
FIGS. 18-20 illustrate semiconductor processing steps that may be performed to manufacture a spacer-based RRAM memory array in accordance with another embodiment of the present invention.
Figure 19:
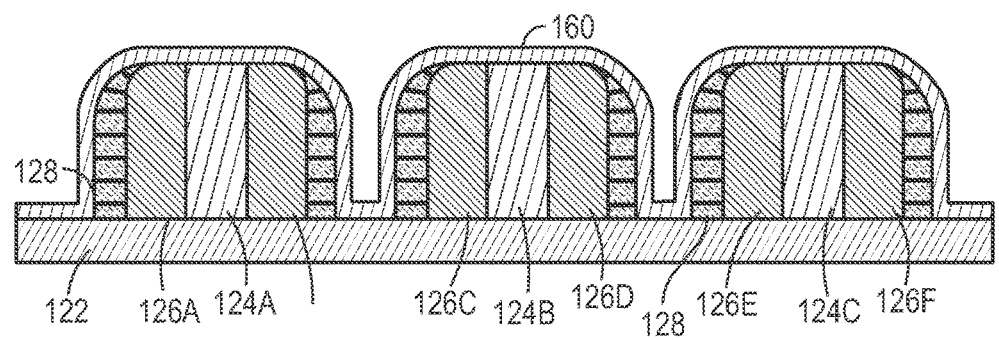
Figure 20:
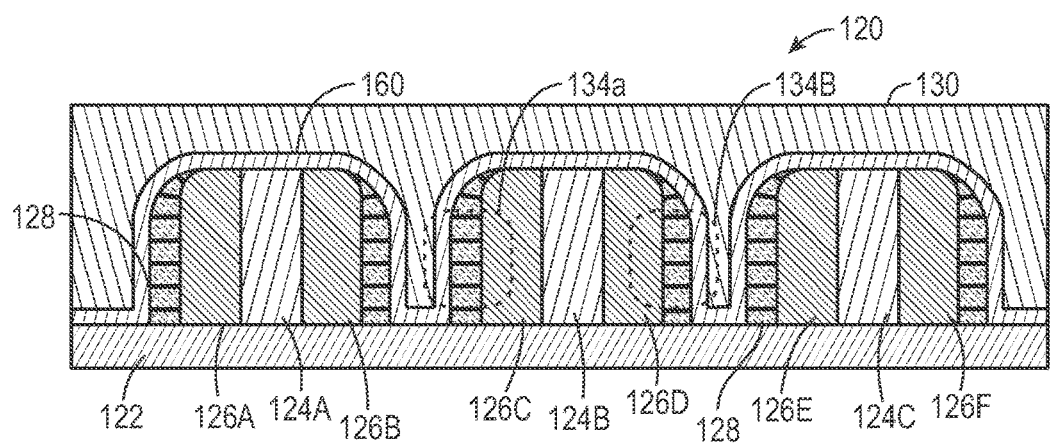

FIGS. 18-20 illustrated an alternate embodiment in which an active film having multiple layers is utilized. For instance, in cases where the active material 128 itself is not sufficiently insulating to prevent shorts between word lines, an additional thin insulating layer may be provided. Referring to FIG. 18, the formation of the insulating layer begins by etching the conformal active layer 128 that was formed in FIG. 16 to form spacers (e.g., 128a, 128b). Next, as shown in FIG. 19, a thin insulating film 160 is deposited over the active layer spacers 128, the word lines 126, and the dielectric features 124. By way of example, the insulating film 160 may include any suitable type of insulating metal oxide (IMO) or may be PCMO. Next, the conductive material 130 is deposited over the insulating film 160 to form a bit line. The resulting structure, which is shown in FIG. 20, still provides a binary layer vertical cell structure, but with the addition of the insulting layer 160, which may prevent bit-line to bit-line shorts.

Figure 21:
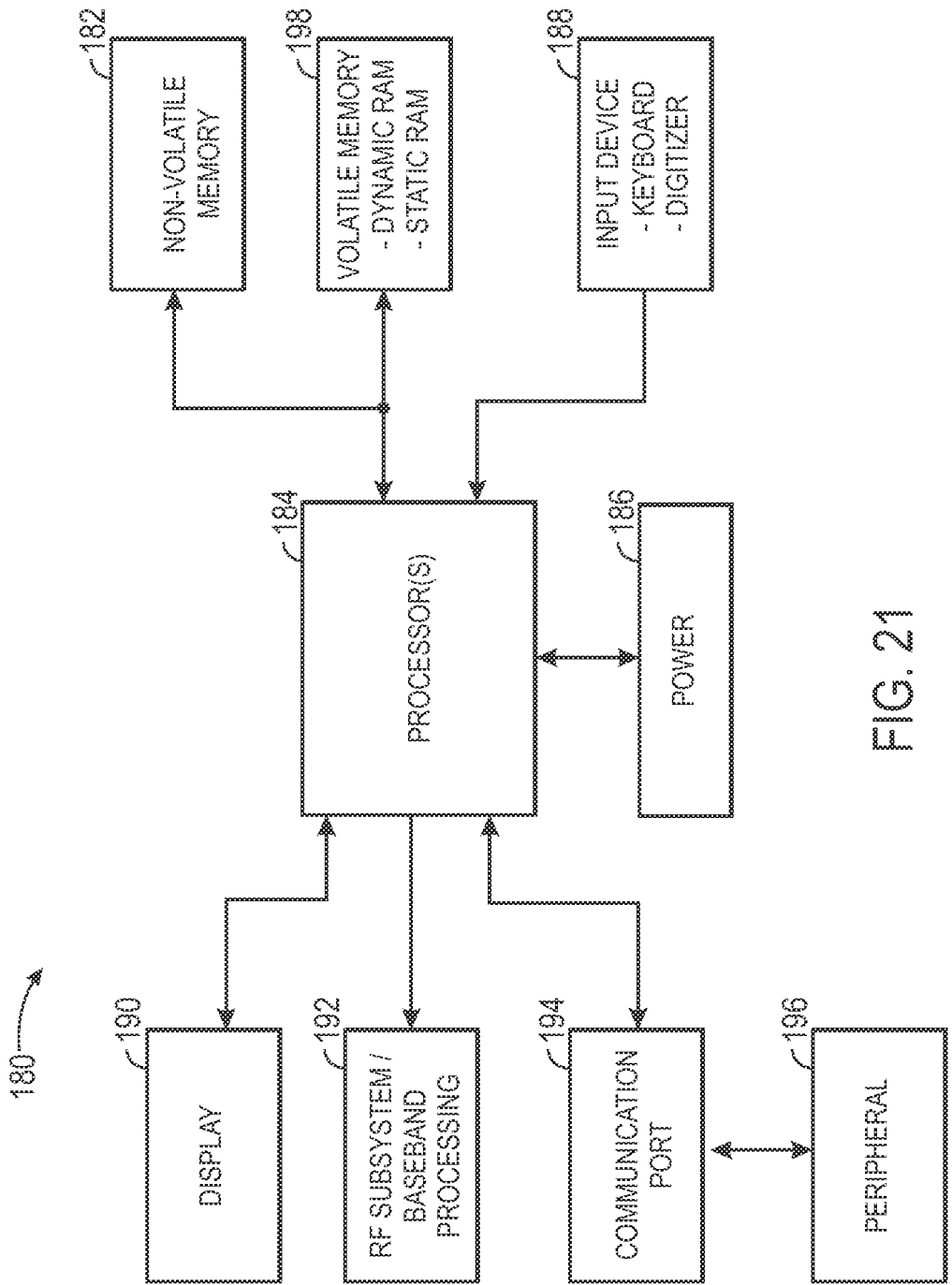
FIG. 21 is a block diagram of a processor-based system in accordance with an embodiment of the present invention.

Having described several exemplary embodiments above, it should be understood that the present techniques for constructing RRAM memory devices, arrays, and cells, may be used in conjunction with various types of computing systems. For instance, FIG. 21 is a block diagram that depicts a processor-based system, generally designated by reference numeral 180, having a non-volatile memory 182 constructed in accordance one or more of the embodiments discussed above. For example, the system 180 may be any of a variety of types such as a computer, pager, cellular phone, personal organizer, control circuit, etc. In a typical processor-based system, one or more processors 184, such as a microprocessor, may control the processing of system functions and requests.

The system 180 typically includes a number of components. For example, the system 180 includes a power supply 186. For instance, if the system 180 is a portable system, the power supply 186 may advantageously include permanent batteries, replaceable batteries, and/or rechargeable batteries, or some combination thereof. The power supply 186 may also include an AC adapter that may enable the system 180 to be plugged into a wall outlet, for instance. Additionally, the power supply 186 may also include a DC adapter such that the system 180 may be plugged into a DC power source, such as vehicle cigarette lighter port, for instance.

Various other devices may be coupled to the processor 184 depending on the functions that the system 180 performs. For instance, an input device 188 may be coupled to the processor 184. The input device 188 may provide a user interface including buttons, switches, a keyboard, a light pen, a mouse, and/or a voice recognition system, for instance. A display 190 may also be coupled to the processor 184. The display 190 may include an LCD display, a CRT, LEDs, and/or an audio display, for example. Furthermore, an RF sub-system/baseband processor 192 may also be coupled to the processor 184. The RF sub-system/baseband processor 192 may include an antenna that is coupled to an RF receiver and to an RF transmitter (not shown). One or more communication ports 194 may also be coupled to the processor 184. The communication port 194 may be adapted to be coupled to one or more peripheral devices 196, such as a modem, a printer, a computer, or to a network, such as a local area network, remote area network, intranet, or the Internet, for instance.

The processor 184 generally controls the system 180 by implementing software programs stored in the memory. For instance, the memory may be operably coupled to the processor 184 to store and facilitate execution of various programs. As shown, the processor 184 may be coupled to a volatile memory 198 which may include Dynamic Random Access Memory (DRAM) and/or Static Random Access Memory (SRAM). As mentioned above, the processor 184 may also be coupled to the non-volatile memory 182. The non-volatile memory 182 may include an RRAM memory device constructed in accordance with one or more of the embodiments depicted above in FIGS. 4-20. Additionally, the non-volatile memory 182 may include a read-only memory (ROM), such as an EPROM, and/or RES memory to be used in conjunction with the volatile memory. Additionally, the non-volatile memory 182 may include magnetic storage such as a tape drives, hard disks, solid-date drives, and the like.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A memory device, comprising:
 a vertical resistive random access memory (RRAM) cell comprising:
  a first electrode;
  a second electrode; and
  an active material comprising an inner circumference having an entirely circular shape and an outer circumference having an entirely circular shape circumscribing the inner circumference, wherein the active material is disposed between the first electrode and the second electrode, wherein the active material directly contacts the first electrode and the second electrode respectively, wherein the second electrode contacts the entire inner circumference of the active material in directly contacting the active material, wherein the active material has variable resistive properties and comprises a columnar grain structure defining a plurality of grain boundaries oriented generally perpendicular to the first electrode and generally perpendicular to the second electrode, wherein the plurality of grain boundaries are oriented generally parallel to a plane of a substrate upon which the RRAM cell is formed.

2. The memory device of claim 1, wherein the application of an activation voltage to the active material creates an electrical field between the first electrode and the second electrode, and wherein the plurality of grain boundaries are oriented generally parallel to the electrical field.

3. The memory device of claim 1, wherein the application of an activation voltage causes the active material to transition from a high resistive state to a low resistive state.

4. The memory device of claim 3, wherein when the active material is in the low resistive state, a conductive pathway is formed between the first electrode and the second electrode and generally along one of the plurality of grain boundaries.

5. The memory device of claim 4, wherein the conductive pathway has a tortuosity of approximately unity.

6. The memory device of claim 1, wherein the active material comprises a polycrystalline material.

7. The memory device of claim 1, wherein the active material comprises at least one of a chalcogenide, a transition-metal oxide, and a complex metal oxide.

8. A memory device, comprising:
 a vertical resistive random access memory (RRAM) cell comprising:
  a first electrode;
  a second electrode; and
  an active material comprising an inner circumference having an entirely circular shape and an outer circumference having an entirely circular shape circumscribing the inner circumference, wherein the active material is disposed between the first electrode and the second electrode, wherein one end of the active material interfaces with a surface of the first electrode, wherein a second end of the active material, opposite to the first end of the active material, interfaces with a surface of the second electrode, wherein the second electrode contacts the entire inner circumference of the active material in interfacing with the second end of the active material, wherein a particular dimension of the first electrode is selected to ensure the creation of at least one grain boundary oriented generally perpendicular to the first electrode and generally perpendicular to the second electrode within the active material that is suitable for the formation of a conductive path between the first electrode and the second electrode when the RRAM cell is in an on state, wherein the at least one grain boundary is oriented generally parallel to a plane of a substrate upon which the RRAM cell is formed.

9. The memory device of claim 8, wherein the first electrode comprises a word line coupled to the RRAM cell, and wherein the particular dimension comprises a height of the word line.

10. The memory device of claim 9, wherein the height of the word line is selected as being between approximately 5 nanometers to approximately 100 nanometers.

11. The memory device of claim 8, wherein the first electrode comprises a word line coupled to the RRAM cell, wherein the surface of the word line that interfaces with the active material has one of a convex or a concave shape, and wherein the particular dimension comprises a distance of a curvature of the convex or the concave surface.

12. The memory device of claim 11, comprising a first dielectric layer disposed below the word line and a second dielectric layer disposed above the word line; wherein, if the interfacing surface of the word line is convex, the convex interfacing surface is formed by applying a semi-selective etchant that removes portions of the first and second dielectric layers at a faster rate than portions of the word line; and wherein, if the interfacing surface of the word line is concave, the concave interfacing surface is formed by applying a semi-selective etchant that removes portions of the word line at a faster rate than portions of the first and second dielectric layers.

13. The memory device of claim 8, wherein varying the particular dimension does not increase an aerial footprint of the RRAM cell.

14. The memory device of claim 8, wherein the RRAM cell comprises a nanoscopic dimension, and wherein the selected particular dimension of first electrode maintains apparent continuum behavior properties in the RRAM cell.

15. A multiple-tier three-dimensional memory device comprising:
a first tier of word lines;
a second tier of word lines formed above the first tier of word lines;
a cavity extending through at least one word line from the first tier and at least one word line from the second tier, wherein the at least one word line from the first tier and the at least one word line from the second tier are in the same vertical plane such that a circumference of the cavity is completely surrounded by each of the at least one word line from the first tier and the at least one word line from the second tier; and
a vertical memory cell structure, wherein the vertical memory cell structure is at least partially disposed in the cavity, wherein the vertical memory cell structure comprises:
an active material disposed circumferentially within the cavity, wherein the active material comprises an inner circumference having an entirely circular shape and an outer circumference having an entirely circular shape circumscribing the inner circumference, wherein the active material comprises a variable resistive material switchable between a low resistive state and a high resistive state;
a conductive element disposed within the cavity, wherein the conductive element is configured to directly contact the entire inner circumference of the active material;
wherein a first resistive memory cell comprises the conductive element, the active material, and the word line from the first tier, and wherein a second resistive memory cell comprises the conductive element, the active material, and the word line from the second tier, wherein the second resistive memory cell is above the first resistive memory cell.

16. The multiple-tier three-dimensional memory device of claim 15, wherein the cavity comprises a through-hole, a trench, or a slot.

17. The multiple-tier three-dimensional memory device of claim 16, wherein if the cavity comprises a through-hole, the conductive element comprises a conductive via.

18. The multiple-tier three-dimensional memory array of claim 15, wherein the plurality of vertical memory cell structures comprises a first vertical memory cell structure, a second vertical memory cell structure, and a third memory cell structure, wherein the first and second vertical memory cell structures are in a first common vertical plane and wherein the first and third vertical memory cell structures are in a second common vertical plane that is perpendicular to the first common vertical plane.

19. The multiple-tier three-dimensional memory array of claim 15, wherein the active material is formed by conformal deposition into the cavity.

20. The multiple-tier three-dimensional memory array of claim 15, wherein the active material is formed by selective deposition onto portions of the word line from the first tier and the word line from the second tier that are exposed within the cavity.

* * * * *